US008080985B2

(12) United States Patent
Ueunten

(10) Patent No.: US 8,080,985 B2
(45) Date of Patent: Dec. 20, 2011

(54) METHOD AND APPARATUS FOR HIGH PERFORMANCE SWITCH MODE VOLTAGE REGULATORS

(75) Inventor: Paul Ueunten, San Jose, CA (US)

(73) Assignee: Monolithic Power Systems, Inc., San Jose, CA (US)

( * ) Notice: Subject to any disclaimer, the term of this patent is extended or adjusted under 35 U.S.C. 154(b) by 0 days.

(21) Appl. No.: 12/898,504

(22) Filed: Oct. 5, 2010

(65) Prior Publication Data

US 2011/0018508 A1    Jan. 27, 2011

Related U.S. Application Data

(63) Continuation of application No. 11/871,910, filed on Oct. 12, 2007, now Pat. No. 7,808,222.

(51) Int. Cl.
*G05F 1/00* (2006.01)
(52) U.S. Cl. .......................................... 323/282; 323/272
(58) Field of Classification Search .......... 323/269–272, 323/282, 283, 351
See application file for complete search history.

(56) References Cited

U.S. PATENT DOCUMENTS

| | | | |
|---|---|---|---|
| 4,797,579 A * | 1/1989 | Lewis ............................. | 326/27 |
| 5,214,320 A | 5/1993 | Truong | |
| 5,455,502 A | 10/1995 | Kato et al. | |
| 5,627,460 A | 5/1997 | Bazinet et al. | |
| 5,757,717 A | 5/1998 | Kondou et al. | |
| 6,046,641 A * | 4/2000 | Chawla et al. ............... | 330/277 |
| 6,255,867 B1 | 7/2001 | Chen | |
| 6,420,924 B1 * | 7/2002 | Lundberg ...................... | 327/333 |
| 6,437,611 B1 * | 8/2002 | Hsiao et al. .................. | 327/108 |
| 6,627,951 B2 | 9/2003 | Hshieh et al. | |
| 6,878,996 B2 | 4/2005 | Rothleitner | |
| 7,119,508 B2 | 10/2006 | Kurosawa et al. | |
| 7,230,406 B2 | 6/2007 | Huang et al. | |

* cited by examiner

*Primary Examiner* — Adolf Berhane
*Assistant Examiner* — Emily Pham
(74) *Attorney, Agent, or Firm* — Perkins Coie LLP

(57) ABSTRACT

Circuit configurations for a high power switch-mode voltage regulator circuit is disclosed that include an array of Metal Oxide Semiconductor (MOS) switching transistors electrically coupled to one another at their drains and sources and a plurality of gate driver circuits. Each gate driver circuit is coupled to a gate and dedicated to driving only one MOS switching transistor.

6 Claims, 16 Drawing Sheets

METHOD AND APPARATUS FOR HIGH PERFORMANCE SWITCH MODE VOLTAGE REGULATORS

This application is a continuation of U.S. patent application Ser. No. 11/871,910, filed on Oct. 12, 2007 now U.S. Pat. No. 7,808,222 and titled METHOD AND APPARATUS FOR HIGH PERFORMANCE SWITCH MODE VOLTAGE REGULATORS, the disclosure of which is herein incorporated by reference in its entirety.

TECHNICAL FIELD

The present invention relates generally to the field of analog integrated circuits. More specifically, the present invention relates to switch-mode voltage regulators.

BACKGROUND

Low cost, miniaturization, efficiency, and high performances are key factors that determine the successes in today consumer electronics. That is, consumers prefer low cost, small, high performance, electronic products that are also energy efficient. Efficient and high performing products require the use of integrated circuits such as switch-mode voltage regulators to deliver high amounts of power efficiently. Low costs require that the semiconductor integrated circuits use simple, fewer processing steps so that the manufacturing cost per unit is low. Miniaturization drives the integrated circuits toward using the least amount of silicon area within a semiconductor chip. Over the years, efforts to improve the cost-size-performance requirements have proven that the conventional circuit architecture and their manufacturing methods may have reached its performance limitations. Maintaining the same circuit architecture and layout while attempting to achieve the cost-size-performance requirements only increase costs and obtains unsatisfactory results.

With reference to FIG. 1A, the schematic diagram of a conventional switch-mode voltage regulator circuit 100 connected to a load ($R_L$) 160 is described. Conventional circuit architecture and layout for switch-mode voltage regulator circuit 100 typically includes a gate driver circuit block 101, a switching circuit block 110, and a boot strap charging circuit block 120, which are all laid out separately as discrete components on a semiconductor die. Switching circuit block 110 further includes a high-side power Metal Oxide Field Effect Transistor (MOSFET) switch 102, a low-side power Metal Oxide Field Effect Transistor (MOSFET) switch 103. The switch output (SW) of conventional switch-mode voltage regulator circuit 100 is then connected to an output filter 150 and to boot strap charging block 120.

More particularly, gate driver circuit block 101 includes a high-side gate driver circuit 101$_{HS}$ and a low-side gate driver circuit 101$_{LS}$. High-side gate driver circuit 101$_{HS}$ is connected in series to high-side power MOSFET switch 102 while low-side gate driver circuit 101$_{LS}$ is connected to low-side power MOSFET switch 103 of switching circuit block 110. The input terminal of high-side gate driver circuit 101$_{HS}$ receives an inverse drive signal ($\overline{PWM}$) that drives the gate of high-side power MOSFET switch 102. Accordingly, high-side gate driver circuit 101$_{HS}$ connects a boot strap supply node ($V_{BST}$) 101U to the gate of high-side power MOSFET switch 102 at a logic LOW input and connects the gate of high-side MOSFET switch 102 gate to source and a switch node (SW) 101SW at a logic HIGH input. The input terminal of low-side gate driver circuit 101$_{LS}$ receives a drive signal (PWM) that drives low-side power MOSFET switch 103. Accordingly, low-side gate driver circuit 101$_{LS}$ connects supply voltage ($V_{CC}$) to the gate of low-side MOSFET switch 103 at a logic LOW input and connects the gate of low-side MOSFET switch 103 to the source and an electrical ground 101G at a logic HIGH input.

Continuing with the description of the conventional architecture of switch-mode voltage regulator circuit 100, the drain of high-side power MOSFET switch 102 is connected to receive an unregulated input voltage ($V_{IN}$). The source of high-side power MOSFET switch 102 is connected to the drain of low-side power MOSFET switch 103 at switch node (SW) 101SW. The source of low-side power MOSFET switch 103 is connected to electrical ground 110G.

Referring again to conventional architecture of FIG. 1A, output filter 150 includes an inductor 151 connected to an output capacitor ($C_{OUT}$) 152. The first terminal of inductor 151 is connected to switch node 101SW, the second terminal of inductor 151 is connected to output capacitor ($C_{OUT}$) 152 to form an output terminal 161 of prior-art switch mode voltage regulator 100. The other terminal of output capacitor ($C_{OUT}$) 152 is connected to electrical ground 110G and to the source terminal of low-side power MOSFET switch 103.

Finally, in the conventional architecture as shown in FIG. 1A, boot strap charging circuit block 120 includes a diode ($D_1$) 121 and a boot capacitor ($C_{BOOT}$) 122. The anode terminal of diode ($D_1$) 121 is connected to supply voltage ($V_{CC}$) 123, while the cathode terminal is connected to one end of boot capacitor ($C_{BOOT}$) 122 at pull-up node 101U. The other end of capacitor ($C_{BOOT}$) 122 is connected to switch node (SW) 101SW.

In operation, high side MOSFET switch 102 receives an inverse drive signal ($\overline{PWM}$) at the input terminal of high-side gate driver circuit 101$_{HS}$. Accordingly, high-side power MOSFET switch 102 is either turned on or turned off, depending on the voltage level of the drive signal ($\overline{PWM}$) signal. At the same time, low-side MOSFET switch is OFF because low-side gate driver circuit 101$_{LS}$ receives the opposite driver signal (PWM). The turning on of high-side power MOSFET switch 102 and turning off low-side power MOSFET 103 causes switch node (SW) 101SW to be coupled to input voltage ($V_{IN}$). Conversely turning on of low-side power MOSFET switch 103 and turning off high-side power MOSFET 102 causes switch node (SW) 101SW to be coupled to electrical ground 101G. In switch-mode regulators, the turn on and off cycle of high-side MOSFET switch 102 and low-side MOSFET switch 103 is substantially greater than the filter frequency of formed by inductor 151 and capacitor filter 152. Hence, output voltage terminal ($V_{OUT}$) 161 is the time average of input voltage ($V_{IN}$) and the PWM signal's duty cycle. The result of the rising and falling of the inductor current ($I_L$) cause an average output voltage ($V_{OUT}$) to be seen by load ($R_L$) 160. Therefore, the output voltage ($V_{OUT}$) at output terminal 161 is proportional to the input voltage ($V_{IN}$) and either the duty cycle or the frequency of the pulse width modulation signal (PWM). Boot strap charging circuit 120 ensures that high-side gate driver circuit 101$_{HS}$ receives voltages to turn on and off high-side power MOSFET switch 102.

The circuit architecture of conventional switch mode voltage regulator 100 described above can be pushed to deliver only a limited amount of current and power efficiency. Beyond this limitation, the cost-performance of conventional switch mode voltage regulator 100 seems to degrade significantly. This is due to the inherent limitations of high-side power MOSFET switch 102, low-side power MOSFET switch 103, and the conventional circuit architecture and layout that give rise to high interconnection resistance and high switching loss, especially when switching at high frequencies. High interconnection resistance causes high switching loss that renders conventional switch mode voltage regulator 100 undesirable. Furthermore, the architecture and layout of prior-art switch mode voltage regulator 100 that involves separate discrete components are difficult to meet the miniaturization trend in today integrated circuits.

Referring now to FIG. 1B, a model circuit 100B for the high-side gate driver circuit $101_{HS}$, its corresponding high side MOSFET switch 102, low-side gate driver circuit $101_{LS}$, and its corresponding low side MOSFET switch 103 in conventional switch-mode voltage regulator circuit 100 is shown. In switch-mode voltage regulator circuits such as switch-mode voltage regulator circuit 100 in FIG. 1A, a critical parameter affecting efficiency is how fast the high-side MOSFET switch 102 and low-side MOSFET switch 103 can turn on and off. Typically, a real world MOSFET switch has a gate coupling resistance capacitance product that can be modeled as a RC circuit electrically coupled to an ideal MOSFET switch. The rise time of the gate coupling resistance capacitance product in response to a Pulse Width Modulation (PWM) determines how fast and how efficient a MOSFET switch can switch. High-side power MOSFET switch 102 includes a gate resistance ($R_{GATE}$) 102R and a gate capacitance ($C_{GATE}$) 102C, both of which electrically coupled to an ideal MOSFET switch 102W having an ON drain source resistance ($R_{DS(ON)}$). In ideal high-side MOSFET switch 102W, the drain terminal is electrically connected to a supply pad 102SP while the source terminal is electrically connected to a switch pad 101SW. High-side gate driver circuit $101_{HS}$ is an inverter that includes a pull-up PMOS transistor $101_{HSUP}$ and a pull-down NMOS transistor $101_{HSDN}$. Similarly, in ideal low-side MOSFET switch 103W, the drain terminal is electrically connected to switch pad 101 SW while the source terminal is electrically connected to a ground pad 101G. Low-side gate driver circuit $101_{LS}$ is an inverter that includes a pull-up PMOS transistor $101_{LSUP}$ and a pull-down NMOS transistor $101_{LSDN}$.

In practice, gate resistance ($R_{GATE}$) of a MOSFET switch is typically 2 ohms and gate capacitance ($C_{GATE}$) is typically 5 nano farads (5 nF). The gate coupling resistance capacitance product (also known as time constant $T_{DISCRETE}$) of conventional circuit architecture and layout for prior-art switch-mode voltage regulator circuit 100 is: $T_{DISCRETE}=C_{GATE}*R_{GATE}=(5\text{ nF})\times(2'\Omega)=10$ nsec. With this time constant ($T_{DISCRETE}$) of 10 nano seconds, the conventional architecture will yield a power loss of more than 1 watts when switching frequency is above 500 kHz, and the output current is above 20 Amps. This is because switching loss is a significant power loss factors for switch-mode voltage regulator 100 when the switching frequency is above 500 kHz. Switching loss ($L_S$) approximately equals to the product of input voltage ($V_{IN}$), switching frequency ($F_S$), output current ($I_{OUT}$), rise time ($T_{DISCRETE}$). In other words, $$L_S \sim V_{IN} \times F_S \times I_{OUT} \times \frac{T_{DISCRETE}}{2}.$$

As described above in FIG. 1A, given input voltage ($V_{IN}$), switching frequency ($F_S$), output current ($I_{OUT}$), and power loss ($L_S$) are fixed by design specifications, the conventional architecture and layout of prior-art switch-mode voltage regulator circuit 100 that involves discrete components cannot reduce the time constant ($T_{DISCRETE}$). Thus, what needed now is a new circuit architecture and layout for switch-mode voltage regulator circuits that can substantially reduce the time constant or the gate coupling resistance capacitance product ($T_{DISCRETE}$) of the MOSFET switches, thus improving the cost-performance factor of a switch-mode voltage regulator.

Accordingly, there are needs for a novel circuit architecture and layout for a switch-mode voltage regulator that does not have the limitations of a conventional MOSFET switch in power delivery and efficiency. Moreover, there are needs for a novel circuit architecture that enables a switch-mode voltage regulator to have low manufacturing costs and reduced in size. Finally, there are needs for novel circuit architecture and layout that can substantially reduce the gate coupling resistance capacitance product specified by the RC equivalent of the MOSFET switches so that the interconnection resistance can be substantially reduced at high frequencies. It is expected that the present invention may fulfill these needs.

SUMMARY

An objective of the present invention is to provide a novel circuit architecture and layout for a high power switch-mode voltage regulator integrated circuit that achieves low interconnection resistance, high current handling capability, small package size, and inexpensive manufacturing costs. Accordingly, a circuit configuration for a high power switch-mode voltage regulator circuit is disclosed that includes an array of Metal Oxide Semiconductor (MOS) switching transistors electrically coupled to one another at their drains and sources, and a plurality of gate driver circuits. Each gate driver circuit is coupled substantially close to the gate and dedicated to driving only one MOS switching transistor.

Another objective of the present invention is to provide a method of providing a high power switch-mode voltage regulator circuit. The disclosed method includes the steps of providing an array of switching elements, providing a plurality of gate driver circuit such that each gate driver circuit is electrically coupled and dedicated to driving only one switching element, and providing a plurality of electrical input/output nodes to facilitate the communication between the switching element and gate driver circuit pair to external circuitry.

These and other advantages of the present invention will no doubt become obvious to those of ordinary skill in the art after having read the following detailed description of the preferred embodiments, which are illustrated in the various drawing Figures.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail so as not to unnecessarily obscure aspects of the present invention.

Figure 2A:
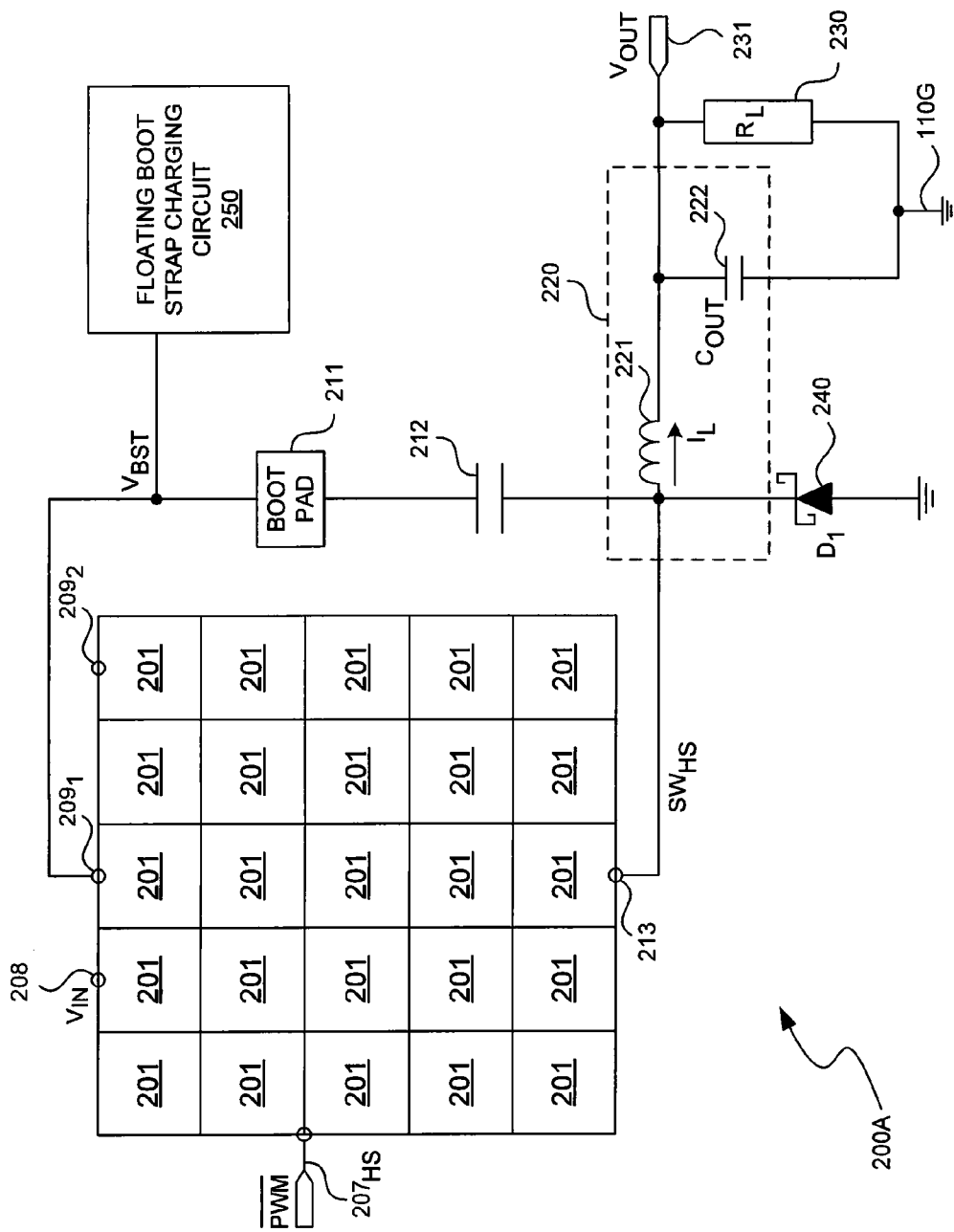
FIG. 2A illustrates a block diagram of a high power switch-mode voltage regulator circuit architecture that include an array of switching elements and corresponding gate driver circuit all integrated together in a single semiconductor chip in accordance with an embodiment of the present invention.

Now referring to FIG. 2A, a circuit architecture (configuration) for a high power switch-mode voltage regulator circuit 200A that includes an array of switching elements 201, an output filter 220, and a floating boot strap charging circuit 250 in accordance with an embodiment of the present invention is illustrated. More particularly, array of switching elements 201 is arranged in rows and columns, and a plurality of input/output (I/O) electrical nodes further including an inverse drive signal node ($\overline{PWM}$) $207_{HS}$, an input voltage node 208, at least one voltage supply node $209_1$-$209_2$, and a switch node (SW) 213. It is noted that "an electrical node" in the present application is defined as electrical means for operating and communicating electrical variables such as currents and voltages between high power switch-mode switching regulator 200A with external circuitry. Examples of "electrical node" includes, but not limited to, electrical pads, power buses, electrical wires, electrical lines, bond wires, flip chip bumps, and finger shaped structures of a lead frame structures, electrical leads, all are within the scope of the present invention.

In particular, drive signal node $207_{HS}$ receives an inverse Pulse Width Modulation ($\overline{PWM}$) signal for driving switching elements 201. Input voltage node 208 couples an unregulated input voltage ($V_{IN}$) into array of switching elements 201. At least one supply voltage node $209_1$-$209_2$ includes a first supply voltage node $209_1$ that couples a boot strap voltage ($V_{BST}$) into array of switching elements 201. In one embodiment, at least one supply voltage node $209_1$-$209_2$ also includes a second supply voltage node $209_2$ that couples a second supply voltage ($V_{EE}$) into array of switching elements 201. Switch node (SW) 213 sums up all the currents from each switching element 201. In addition, switch node (SW) 213 is also an output node that is connected to output filter 220. Output filter 220 includes an inductor 221 connected in series to an output capacitance 222. The second terminal of output capacitance 222 is connected to electrical ground 110G. An output terminal 231 supplies the desired output voltage ($V_{OUT}$). First supply voltage node $209_1$ is also connected to floating boot strap charging circuit 250 and a boot capacitor ($C_{BOOT}$) 212. The second terminal of boot strap capacitor ($C_{BOOT}$) 212 is connected to switch node (SW) 213 and to the first terminal of inductor 221. In one embodiment, an asynchronous diode ($D_1$) 240 is also included. The cathode terminal electrically coupled to switch node (SW) 213 and the anode terminal electrically coupled to electrical ground 110G. In one embodiment, a boot pad 211 is electrically coupled to at least one supply voltage node $209_1$-$209_2$ and to floating boot strap charging circuit 250. The other side of boot pad 211 is electrically coupled to boot capacitor ($C_{BOOT}$) 212 which is electrically coupled to output filter 220 and to asynchronous diode ($D_1$) 240 at high node (SW) 213.

Figure 1A:
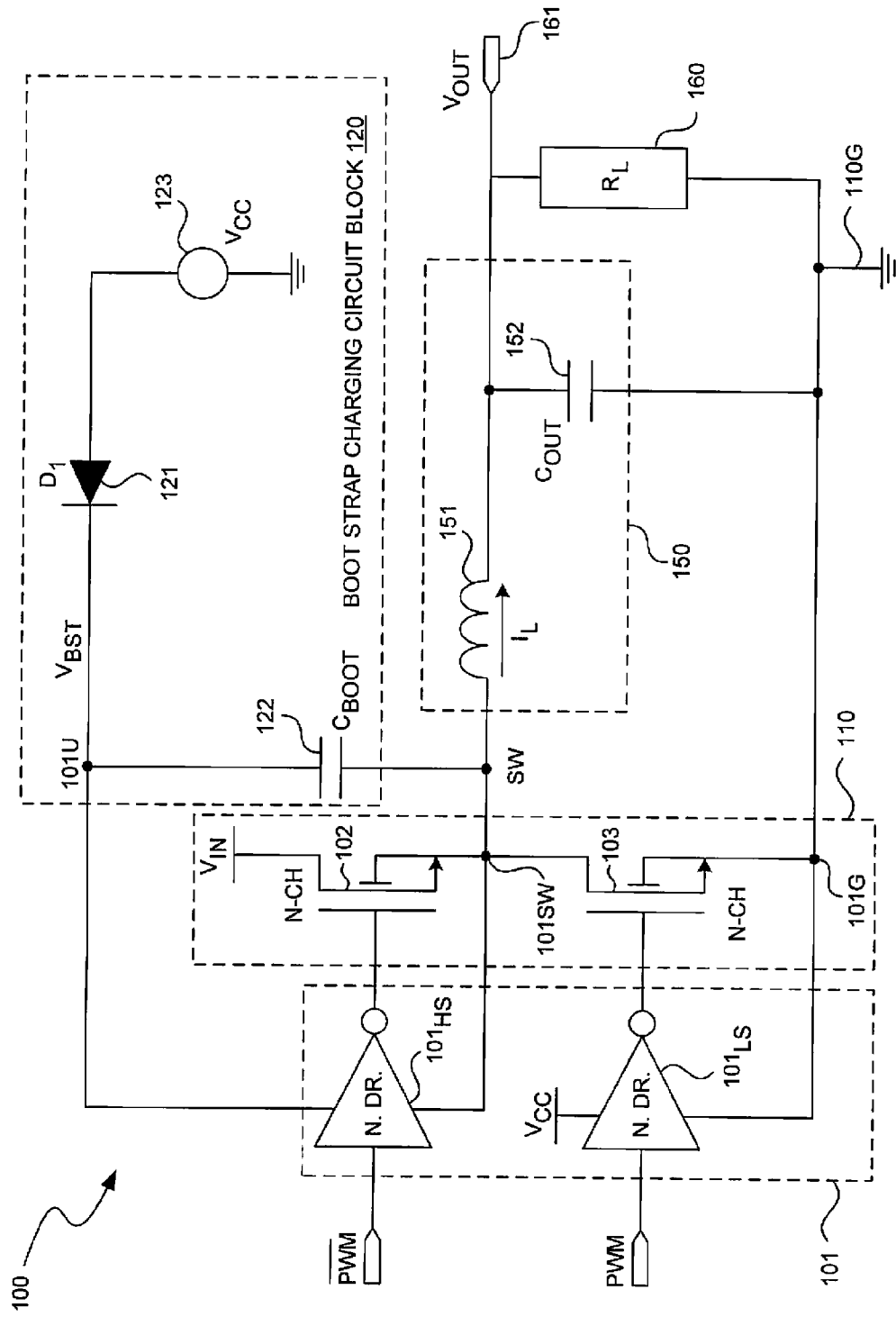
FIG. 1A illustrates a prior art switch-mode voltage regulator circuit architecture that includes a driver circuit block, a switching circuit block, and an output filter block, all laid out as separate discrete components on a semiconductor chip.

Continuing with FIG. 2A, in operation, each switching element 201 is operable to connect unregulated supply node ($V_{IN}$) 208 high side switch node (SW) 213 upon receiving an inverse drive signal ($\overline{PWM}$) at drive signal node $207_{HS}$. At that moment, switch node (SW) 213 sums up all the currents from all switching elements 201 and outputs them to output filter 220. From this point on, high power switch-mode voltage regulator 200A operates on the same principle as any other switch-mode voltage regulator, e.g., output filter 220 operable to filter out ripples and to generate only a constant average output voltage. Floating boot strap charging circuit 250 functions to pass the correct voltage levels to at least one supply voltage nodes $209_1$-$209_2$ so that each switching element 201 receives the correct switching voltages regardless of the voltage level of switch node (SW) 213. In conventional boot strap charging circuits such as switch-mode voltage regulator circuit 100 in FIG. 1A, switch node (SW) $101_{SW}$ has to be at a certain voltage level that it can charge up boot capacitor ($C_{BOOT}$) 122 and pass correct voltage levels to high-side gate driver circuit $101_{HS}$ and low-side gate driver circuit $101_{LS}$.

Figure 2B:
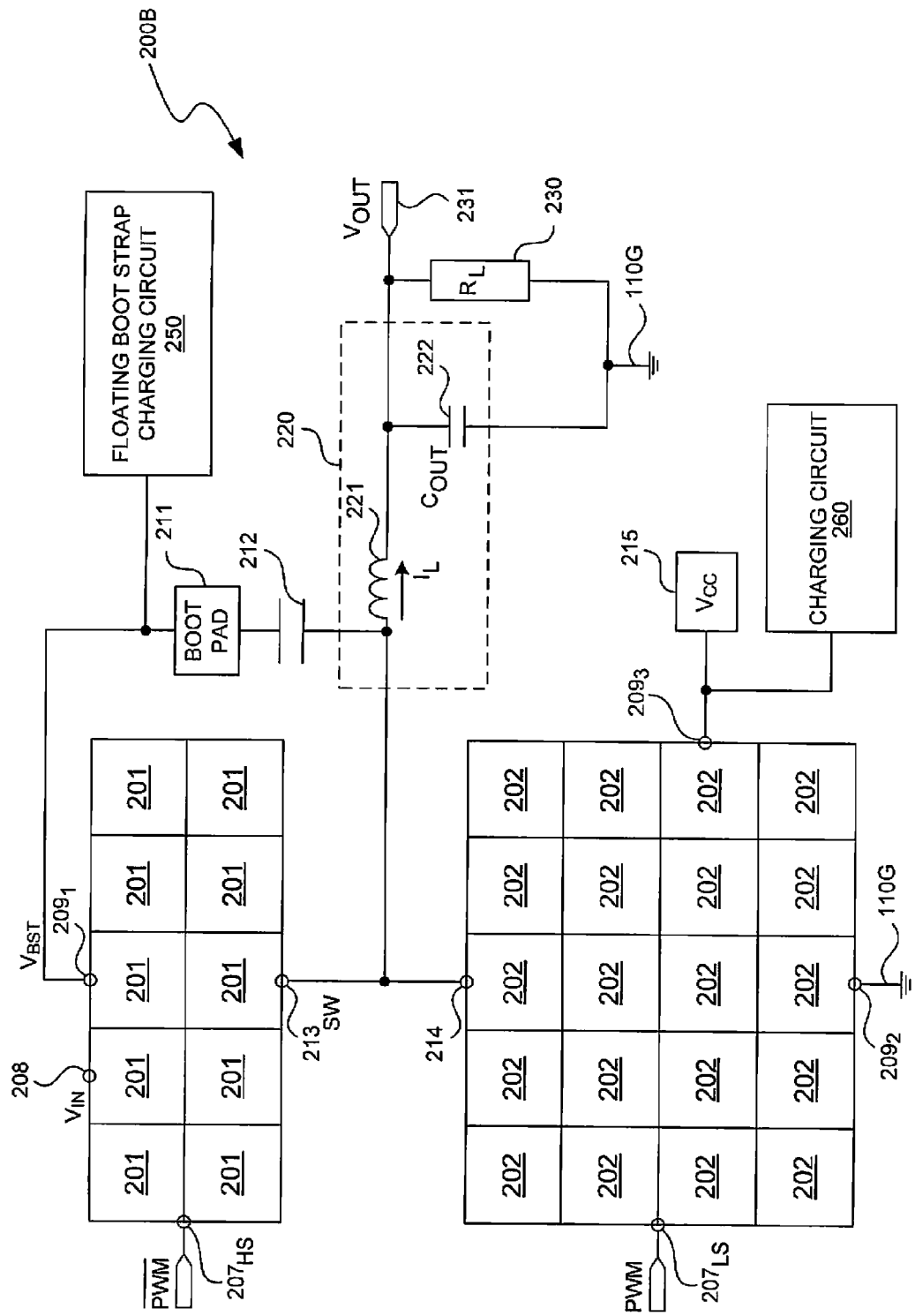
FIG. 2B illustrates a block diagram of an a high power switch-mode voltage regulator circuit architecture that has a high-side switch partitioned into a high-side array of switching elements and a low-side switch partitioned into a low-side array of switching elements in accordance with an embodiment of the present invention.

Now referring to FIG. 2B, an embodiment of the present invention illustrated by a high performance switching voltage regulator 200B that includes a low side array of switching elements 202 in addition to array of switching elements 201. In this configuration, array of switching elements 201 is hereinafter referred to as high-side array of switching elements. High performance switching voltage regulator 200B includes second supply voltage node $209_2$ electrically connected to electrical ground 110G and a third supply voltage node $209_3$ electrically coupled to a charging circuit 260 and to supply voltage ($V_{CC}$) 215. Low-side array of switching elements 202 also includes a low side drive signal node $207_{LS}$, a low-side switch node ($SW_{LS}$) 214. Low side drive signal node $207_{LS}$ receives Pulse Width Modulation (PWM) signal to drive low side switching elements 202. Low-side switch node ($SW_{LS}$) 214 is connected to high-side switch node ($SW_{HS}$) 213 and to output filter 220. Charging circuit 260 regulates voltage levels so that low-side switching elements 202 switch properly.

In operation, each high-side switching element 201 and low-side switching elements 202 are complementarily turned on and off. The currents from high-side switching element 201 are summed up at high-side switch node ($SW_{HS}$) 213 and the currents from low-side switching elements 202 are summed up at low side switch node ($SW_{LS}$) 214. Together, the total currents are delivered to inductor 221 to charge and discharge output capacitor ($C_{OUT}$) 222. As a result, load ($R_L$) 230 sees an average output voltage proportional to the duty cycle of drive signal (PWM) and input voltage ($V_{IN}$).

Figure 2C:
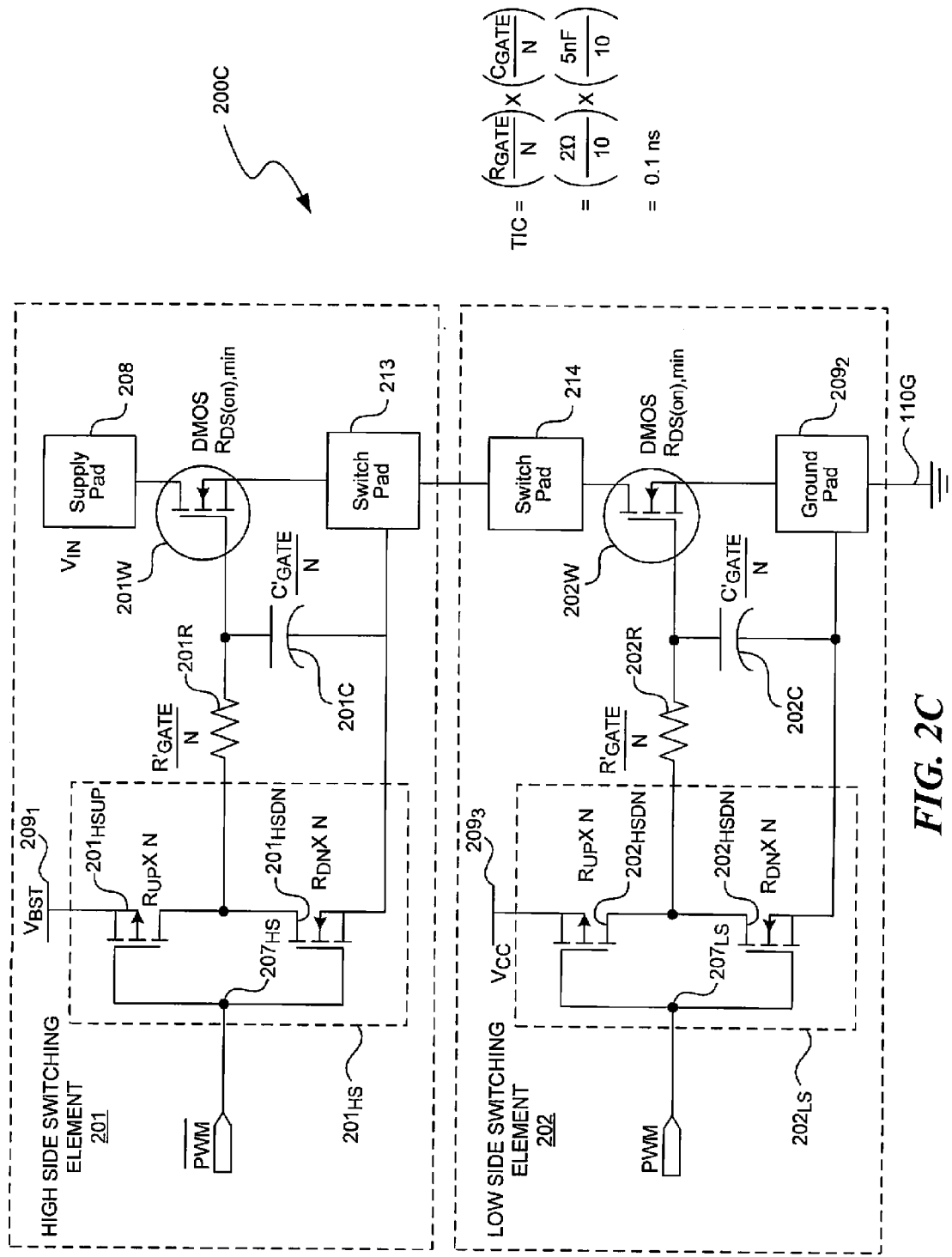
FIG. 2C illustrates an RC equivalent circuit and the gate coupling resistance capacitance product resulted from the architecture and layout of the switch-mode voltage regulator circuit shown in FIG. 2B in accordance with an embodiment of the present invention.

Now referring to FIG. 2C, a model circuit 200C illustrating the gate coupling resistance capacitance product of high side switching element 201 and low side switching element 202 is illustrated. In one embodiment of the present invention, each high-side switching element 201 includes a logic circuitry $201_{HS}$ electrically coupled to dedicatedly drive only one Double Diffused Metal Oxide Field Effect Transistor (DMOS transistor). In practice, each DMOS switch can be modeled by a gate resistor 201R having a gate resistance $R'_{GATE}$ and a gate capacitor 201C having a gate capacitance $C'_{GATE}$, both electrically coupled in series to an ideal DMOS transistor 201W having a minimal ON resistance, $R_{DS(ON),min}$. In one embodiment, logic circuitry $201_{HS}$ is an inverter having a pull-up p-channel Metal Oxide Semiconductor (PMOS) $201_{HSUP}$ and a pull-down n-channel Metal Oxide Semiconductor (NMOS) $201_{HSDN}$. Similarly, each low-side switching element 202 includes a logic circuitry $202_{LS}$ electrically coupled to drive only one Double Diffused Metal Oxide Field Effect Transistor (DMOS transistor) switch. In practice, each DMOS switch can be modeled by a gate resistor 202R having a gate resistance $R'_{GATE}$ and a gate capacitor 202C having a gate capacitance $C'_{GATE}$, both electrically coupled in series to an ideal DMOS switch 202W having a minimal ON resistance, $R_{DS(ON),min}$. In one embodiment, logic circuitry $202_{LS}$ is an inverter having a pull-up p-channel Metal Oxide Semiconductor (PMOS) $202_{HSUP}$ and a pull-down n-channel Metal Oxide Semiconductor (NMOS) $202_{HSDN}$.

Continuing with the model circuit 200C of FIG. 2C, each high-side switch elements 201 and low-side switch element 202 in accordance with an embodiment of the present invention are substantially smaller than high-side switch 101 and low-side switch 102 respectively. Accordingly, the gate resistance ($R'_{GATE}$) and the gate capacitance ($C'_{GATE}$) of high-side switch elements 201 and low-side switch element 202 are N times smaller than those of the prior art switching regulator circuit 100A. The gate coupling resistance and capacitance product ($T_{IC}$) of switch-mode voltage regulator integrated circuit 200B now becomes:

$$T_{IC} = C'_{GATE} * R'_{GATE}$$
$$= \left(\frac{R_{GATE}}{N}\right) \times \left(\frac{C_{GATE}}{N}\right)$$
$$= \left(\frac{2\Omega}{10}\right) \times \left(\frac{5nF}{10}\right)$$

-continued
$$= 0.$$

Figure 1B:
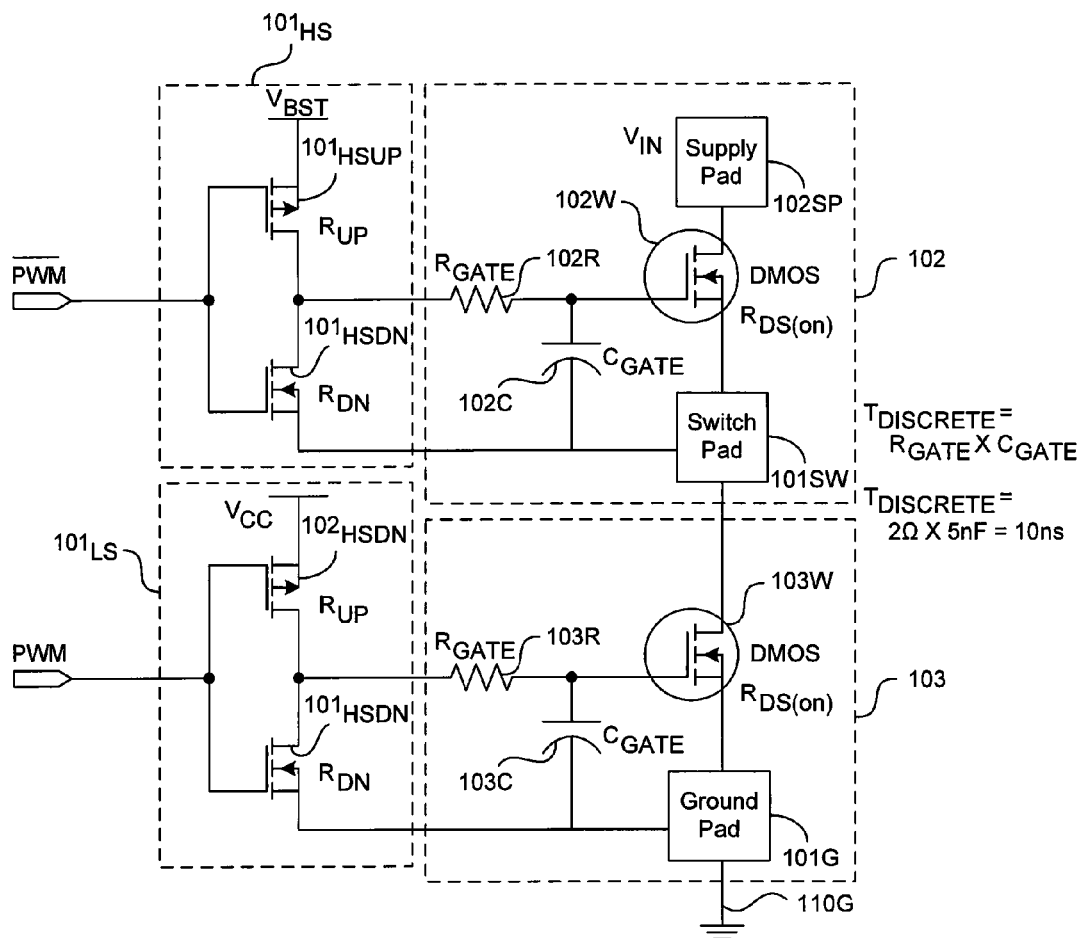
FIG. 1B illustrates a schematic diagram of the circuit architecture of FIG. 1A that has a gate coupling resistance capacitance product and an R-C equivalent circuit.

0.10 nsec. Given the same amount of switching loss ($L_S$), output current ($I_{OUT}$), input voltage ($V_{IN}$), and switching frequency ($F_S$) as those in prior art architecture shown in FIG. 1B, this gate coupling capacitance and resistance product ($T_{IC}$) of the novel circuit architecture and layout will yield a power switching loss $$L_S \sim V_{IN} \times F_S \times I_{OUT} \times \frac{T_{IC}}{2},$$

which is about 100 times smaller than the switching loss of the conventional circuit architecture.

Figure 3A:
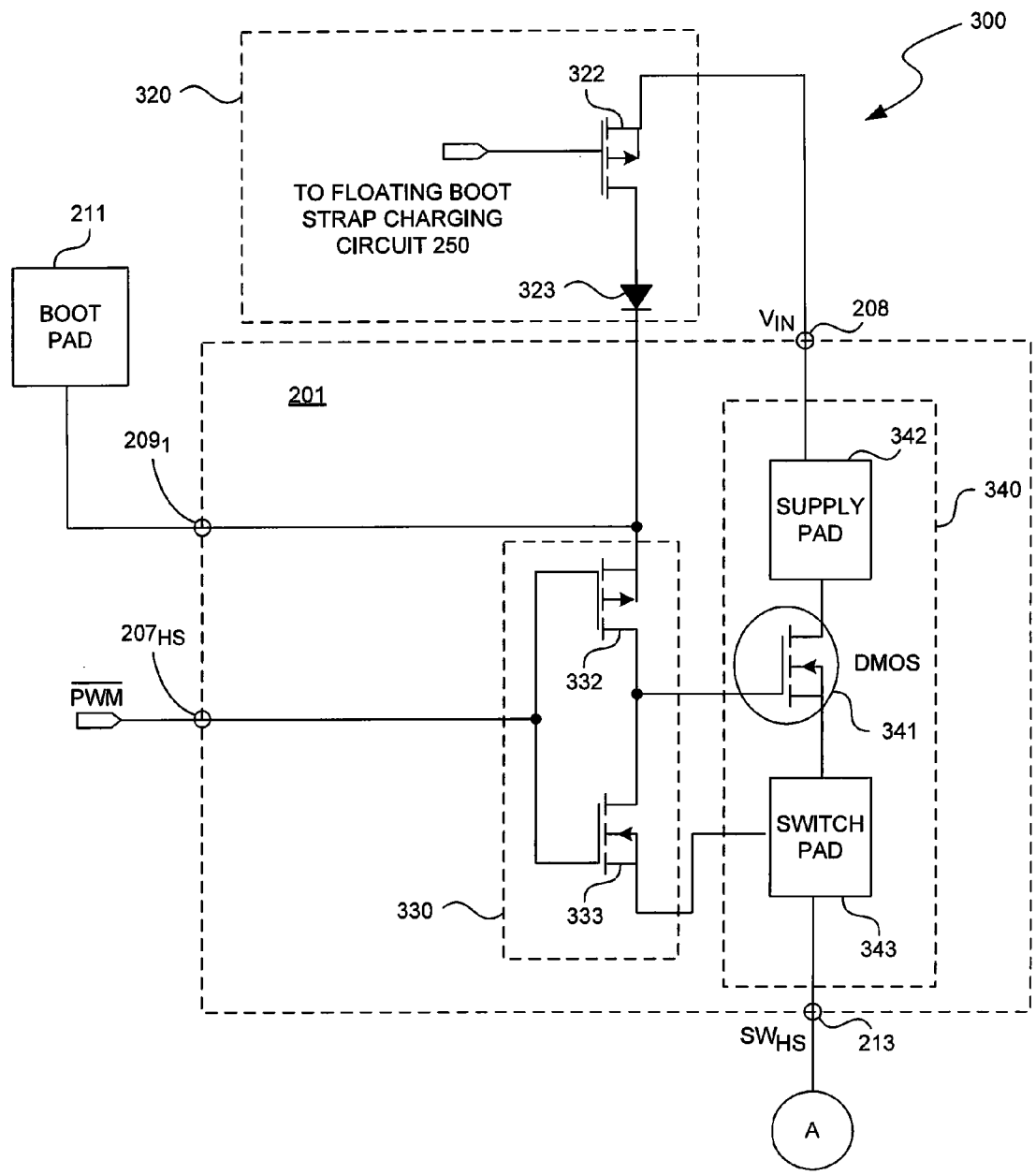
FIG. 3A illustrates a detailed schematic diagram of an exemplary high-side switching element that implements the circuit architecture of FIG. 2B in accordance with an embodiment of the present invention.
Figure 3B:
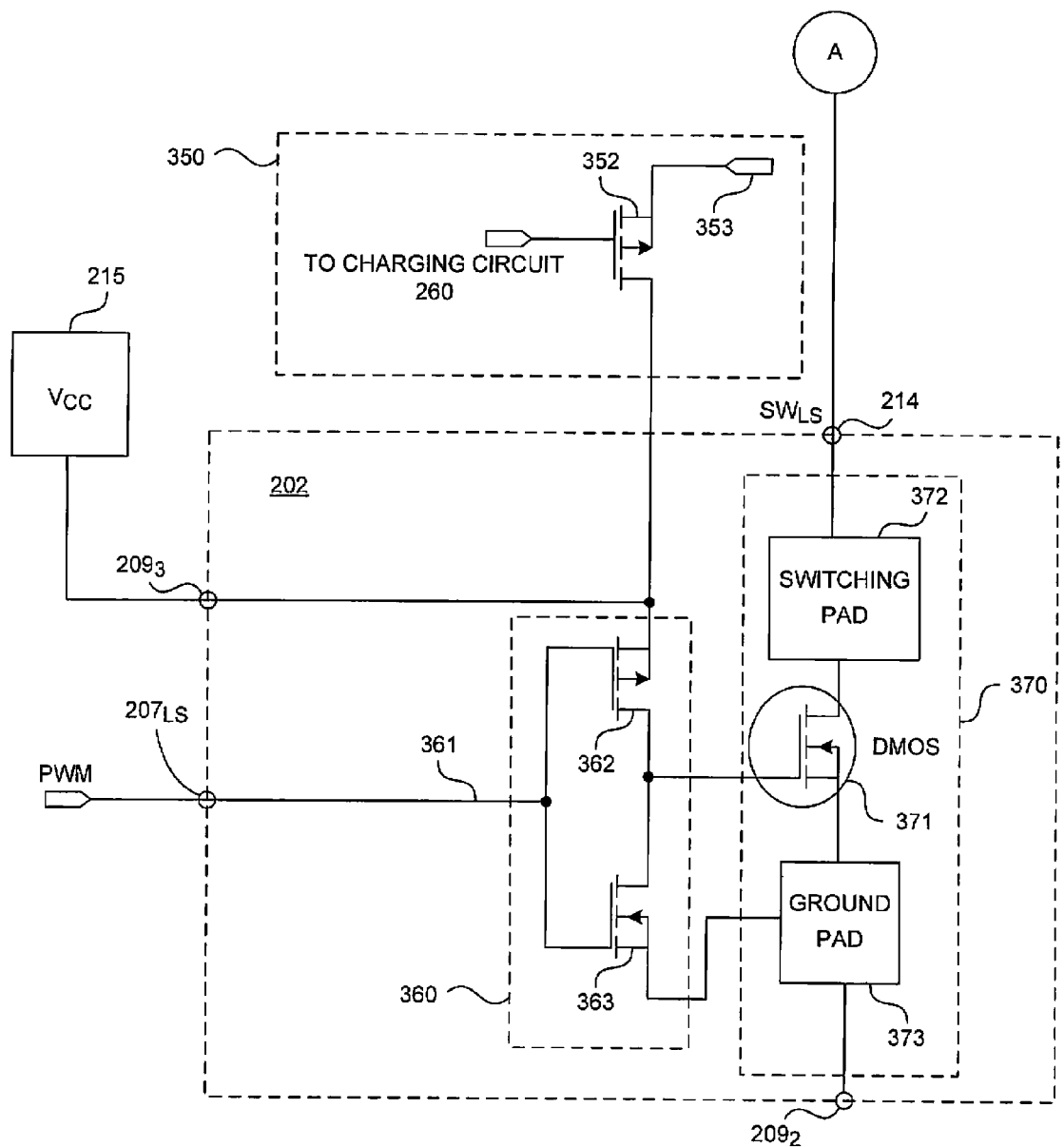
FIG. 3B illustrates a detailed schematic diagram of an exemplary low-side switching element that implements the circuit architecture of FIG. 2B in accordance with an embodiment of the present invention.

Now referring to FIGS. 3A and 3B, a detailed schematic of the switching elements is shown. In particular, FIG. 3A is a detailed schematic of high-side switching element 201 in accordance with an embodiment of the present invention is shown. FIG. 3B is a detailed schematic of low-side switching element 202 in accordance with an embodiment of the present invention is shown. High-side switching element 201 includes a gate driver circuit 330 electrically coupled to drive a switching transistor circuit 340. In one embodiment of the present invention, every column of high-side array of switching elements 201 is connected to a boot pad 211 and passing circuitry 320. It is noted that any combinations of passing circuitry 320 and high-side switching elements 201 thereof are within the scope of the present invention. More particularly, boot pad 211 is electrically connected to first supply voltage node 2091 where supply voltage (VBST) is applied and distributed to every high-side switching element 201. Passing circuitry 320 includes a p-channel Metal Oxide Semiconductor Field Effect Transistor (PMOS) 322 electrically coupled to a diode 323. The drain electrode of PMOS transistor 322 is connected to the anode terminal of diode 323. The gate of PMOS transistor 322 is electrically coupled to receive an output signal from floating boot strap charging circuit 250. In one embodiment of the present invention, gate driver circuit 330 includes a Complementary Metal Oxide Semiconductor (CMOS) inverter having a pull-up p-channel Metal Oxide Field Effect Transistor (PMOS) 332 and a pull-down n-channel Metal Oxide Field Effect Transistor (NMOS) 333. That is, the drain of pull-up PMOS transistor 332 is connected to the drain of pull-down NMOS transistor 333 to form an output terminal of gate driver circuit 330. The gate of pull-up PMOS transistor 332 is connected to the gate of pull-down NMOS transistor 333 to form an input terminal 331 of gate driver circuit 330. In one embodiment of the present invention, input terminal 207HS receives an inverse Pulse Width Modulation ($\overline{PWM}$) signal to turn on and off switching device 340. The source of pull-up PMOS transistor 332 is connected to the cathode terminal of diode 323 and to boot pad 211. In one embodiment, switching transistor circuit 340 includes an n-channel Double Diffused Metal Oxide Semiconductor (DMOS transistor) 341, a supply pad 342, and a switch pad 343. The gate of DMOS 341 is electrically connected to the output terminal of gate driver circuit 330. The source of DMOS transistor 341 is electrically coupled to switch pad 343 and to the source of NMOS transistor 333 of gate driver circuit 330. The drain of DMOS transistor 342 is electrically connected to supply pad 342 and to the drain of passing PMOS transistor 322. In one embodiment, boot pad 211, supply pad 342, and switch pad 343 are input/output (I/O) electrical nodes that facilitate the communication between each high-side switching element 201 and external circuitry (not shown). More specifically, in one embodiment, all supply pads 342 are picked up by input voltage node 208. All switch pads 343 are picked up by switch node (SWHS) 213, and all the sources of pull-up PMOS transistor 332 are coupled to first supply voltage node 209l.

Turning to FIG. 3B, low-side switching element 202 includes a gate driver circuit 360, and a switching transistor circuit 370. In one embodiment, every column of low-side array of switching elements 202 further includes a supply voltage pad (VCC) 215 and passing circuitry 350. It is noted that any combinations of passing circuitry 350 and low-side array of switching elements 202 thereof are within the scope of the present invention. More particularly, supply voltage pad (VCC) 215 is where supply voltage (VCC) is applied. Passing circuitry 350 includes a p-channel Metal Oxide Semiconductor Field Effect Transistor (PMOS) 352. The drain terminal of PMOS transistor 352 is connected to gate driver circuit 360. The gate of PMOS transistor 352 is electrically coupled to receive an output signal from charging circuit 260. Gate driver circuit 360 includes a logic circuitry that receives a logic level signal (PWM) to drive switching transistor circuit 370. In one embodiment of the present invention, gate driver circuit 360 includes a Complementary Metal Oxide Semiconductor (CMOS) inverter having a pull-up p-channel Metal Oxide Field Effect Transistor (PMOS) 362 and a pull-down n-channel Metal Oxide Field Effect Transistor (NMOS) 363. That is, the drain of pull-up PMOS transistor 362 is connected to the drain of pull-down NMOS transistor 363 to form an output terminal of gate driver circuit 360. The gate of pull-up PMOS transistor 362 is connected to the gate of pull-down NMOS transistor 363 to form an input terminal 207LS of gate driver circuit 360. In one embodiment of the present invention, input terminal 207LS receives a Pulse Width Modulation (PWM) signal to turn on and off switching transistor circuit 370. The source of pull-up PMOS transistor 362 is connected to the drain terminal of MOSFET transistor 352 and to supply voltage pad (VCC) 215. Switching transistor circuit 370 includes a Double Diffused Metal Oxide Semiconductor (DMOS) transistor 371, a switch pad 372, and a ground pad 373. The gate of DMOS transistor 371 is electrically connected to the output terminal of gate driver circuit 360. The source of DMOS transistor 371 is electrically coupled to ground pad 373 and to the source of pull-down NMOS transistor 363 of gate driver circuit 360. The drain of DMOS transistor 371 is electrically connected to switch pad 372, switch pad 343, and to the source of pull-down NMOS transistor 333. Supply voltage pad (VCC) 215, switch pad 372, and ground pad 373 are input/output (I/O) electrical nodes that facilitate the communication between low-side switching elements 202 and external circuitry (not shown).

Figure 4A:
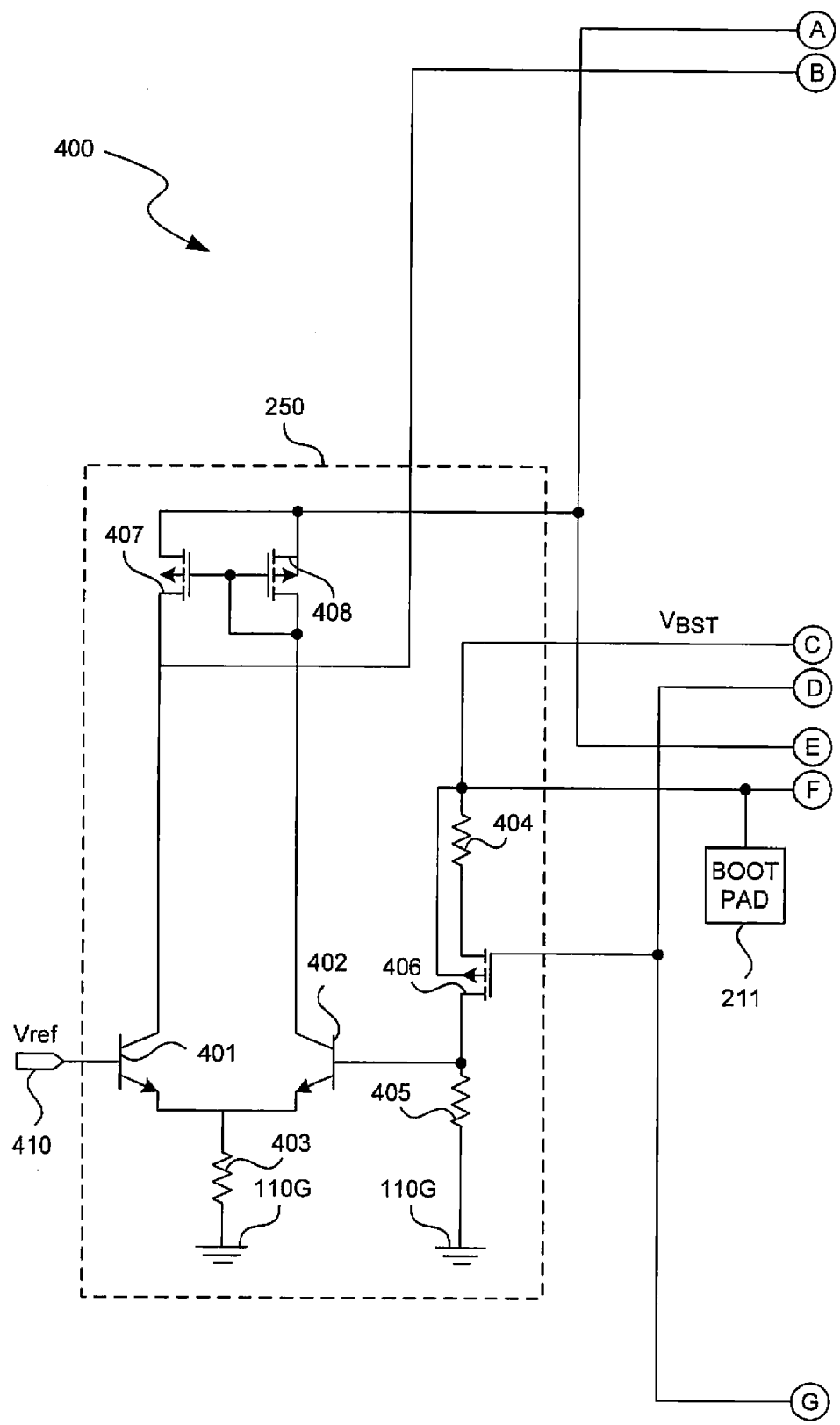
FIGS. 4A through 4C illustrate a detailed schematic diagram of an array of switching elements having a floating boot strap charging circuit in accordance with an embodiment of the present invention.
Figure 4B:
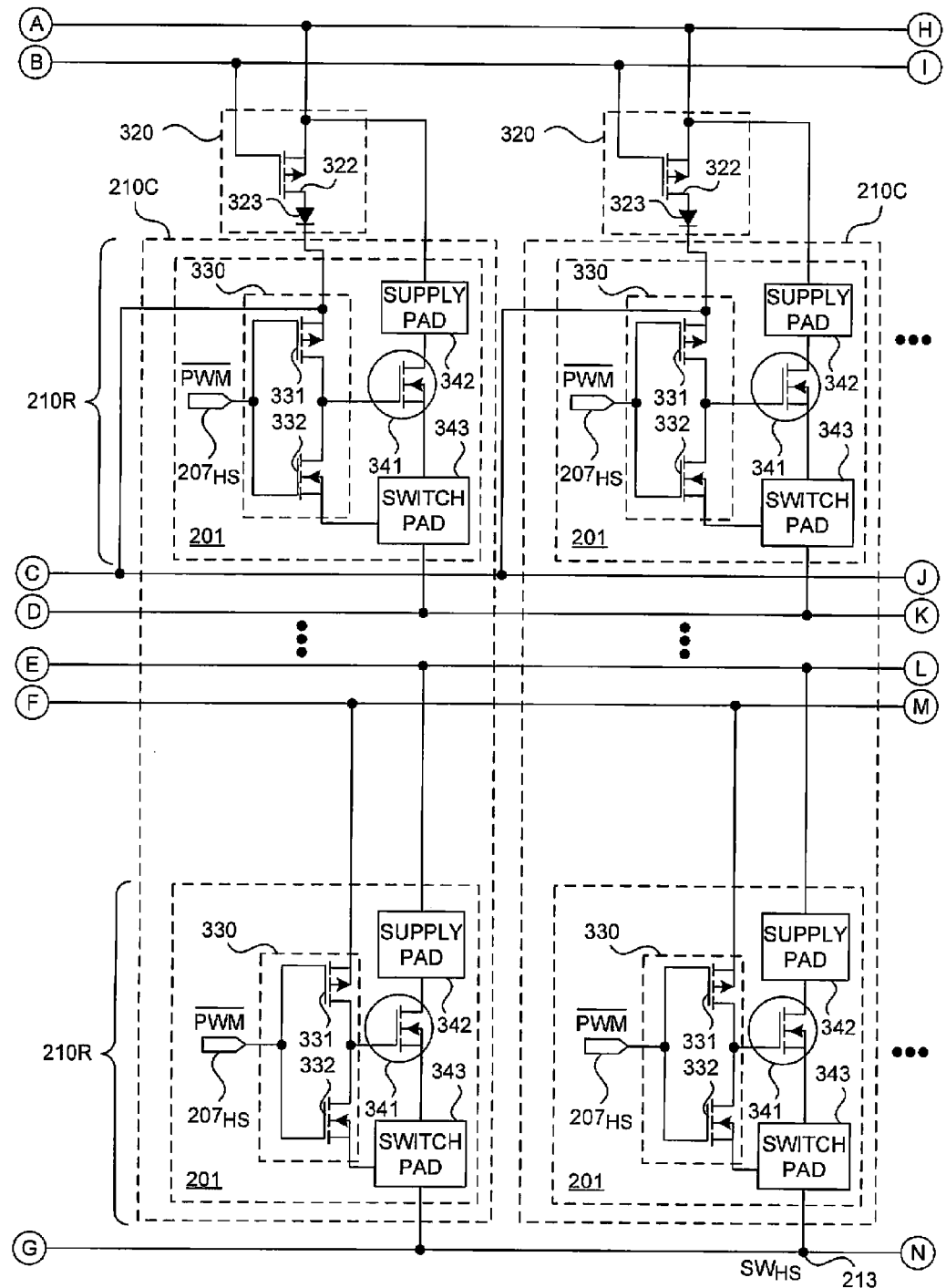
Figure 4C:
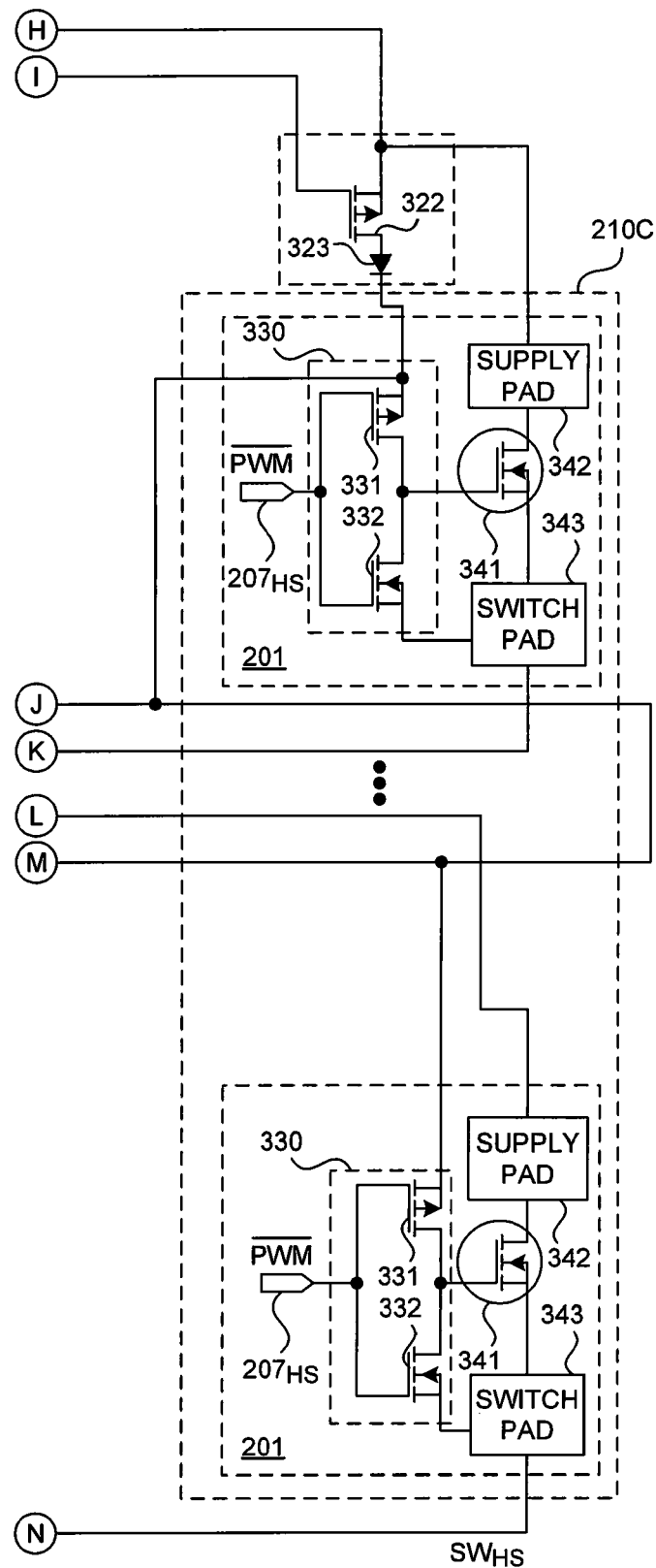

Now referring to FIGS. 4A to 4C, a schematic diagram of high power switch-mode voltage regulator integrated circuit 400 in accordance with an embodiment of the present invention is illustrated. Turning to FIG. 4A, high power switch-mode voltage regulator integrated circuit 400 includes only array of switching elements 201 as described in FIG. 2A and FIGS. 3A and 3B. The switching elements 201 are electrically connected to one another and to floating boot strap charging circuit 250. In one embodiment, floating boot strap charging circuit 250 includes a low drop-out (LDO) voltage regulator circuit that regulates and passes correct voltage levels to each switching element 201. The low drop-out (LDO) voltage regulator circuit includes a differential transconductance amplifier connected in series to a PMOS transistor 406, and to resistors 404-405. The differential transconductance amplifier includes an NPN emitter coupled pair 401-402 biased by a current mirror configured by PMOS transistors 407 and 408. The base of NPN transistor 401 receives a reference voltage (VREF) 410 and the base of NPN transistor 402 receives a voltage proportional to boot strap voltage (VBST). Array of switching elements 201 (FIG. 4C) is coupled to floating boot strap charging circuit 250 via a negative feedback path. More particularly, the negative feedback path begins at the output of the differential transconductance amplifier that is connected to the drain of PMOS transistor 407 which drives PMOS pass transistors 322 (FIG. 4C). The output current of PMOS transistor 322 is coupled to the regulated boot strap voltage (VBST) through diodes 323. As such, a voltage proportional to boot strap voltage (VBST) minus the threshold voltage of PMOS transistor 406 is thus formed across resistor 404. Accordingly, the proportional voltage is imparted across resistor 405, and thus completing the negative feedback path.

Continuing with FIG. 4B, array of switching elements 201 is arranged in rows 210R and columns 210C. In one embodiment, each column 201C has only one passing circuitry 320. More particularly, gate terminals of all PMOS transistors 322 are all connected together and to the output terminal of floating boot strap charging circuit 240 which is the drain terminal of PMOS transistor 407. Supply pads 342 of n-channel DMOS transistors 341 are all connected together and to the source terminals of MOSFET transistors 407 and 408 respectively. The cathode terminals of all diodes 323 of each column 210C are connected together and to boot pad 211. Boot pad 211 is also connected to the second terminal of resistor 404 and to the body of PMOS transistor 406. All switch pads 343 within high power switching regulator 400 are connected together and to the gate terminal of MOSFET transistor 406.

Figure 5A:
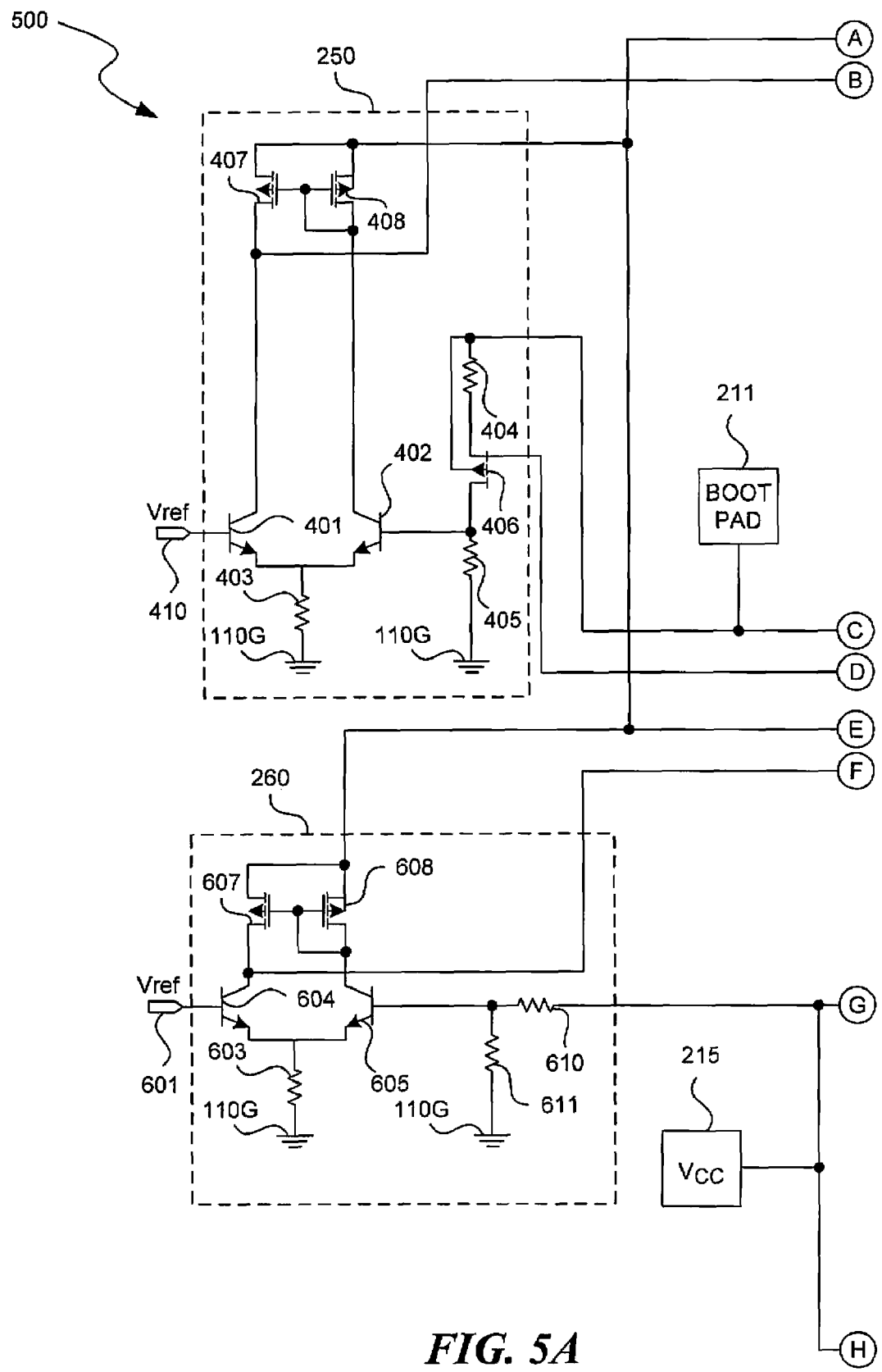
FIGS. 5A through 5C illustrate a detailed schematic diagram of a high-side array of switching elements electrically coupled to a low-side array of switching elements in accordance with an embodiment of the present invention.
Figure 5B:
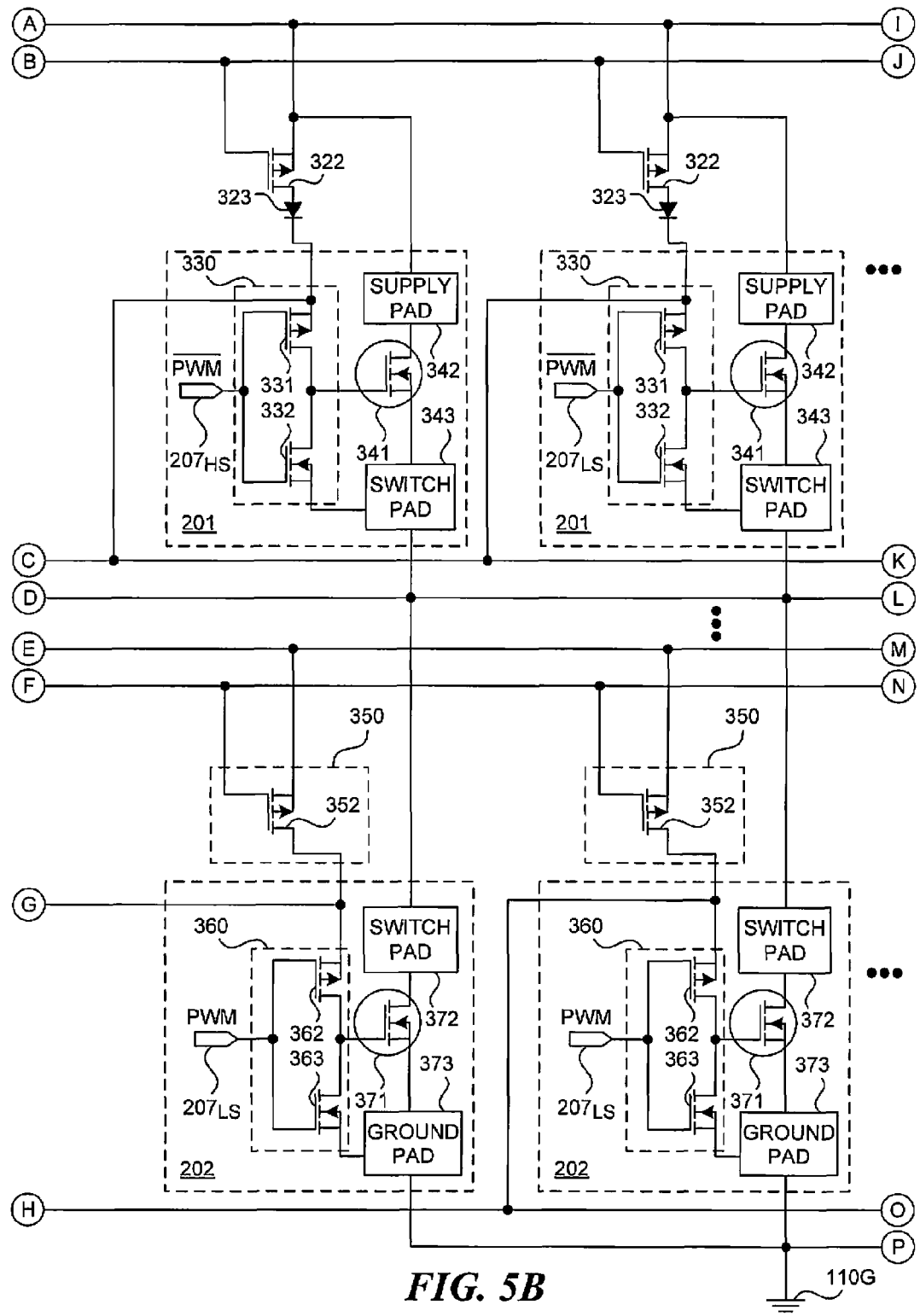
Figure 5C:
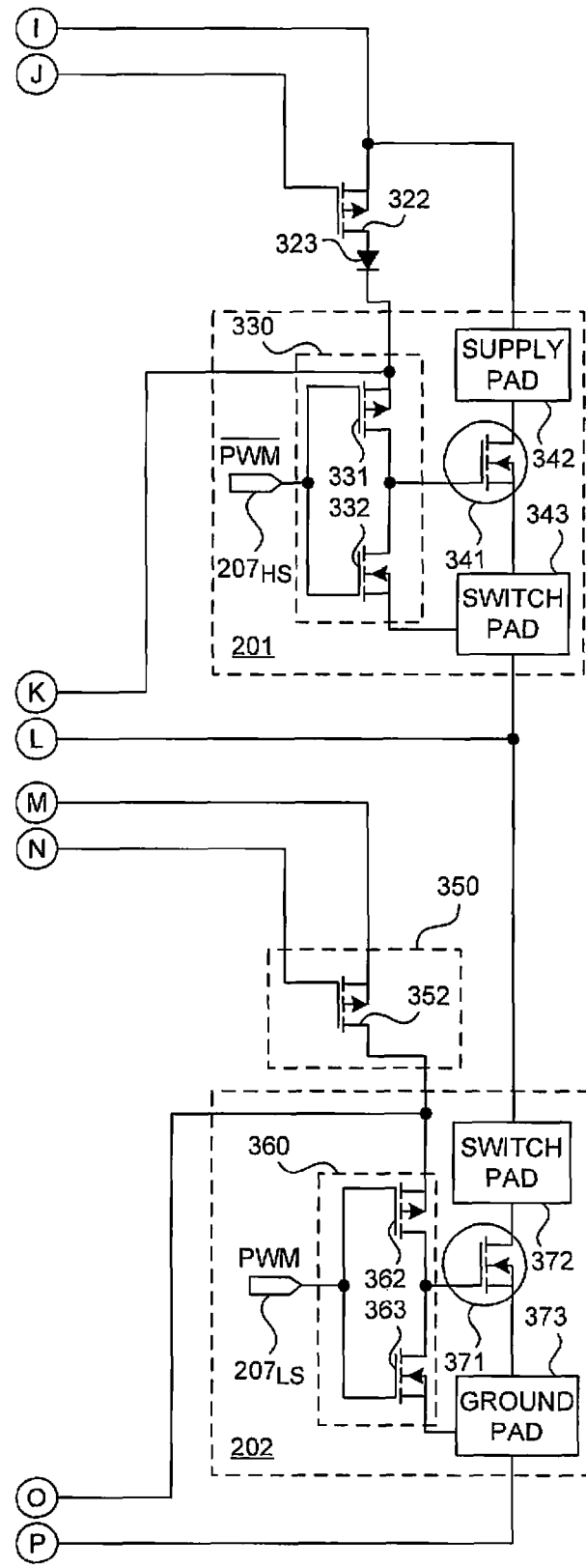

Now referring to FIGS. 5A to 5C, a schematic diagram of a high power switch-mode voltage regulator integrated circuit 500 that includes a high-side array of switching elements 201 and low-side array of switching elements 202 is illustrated. The interconnections between high-side switching elements 201 are as shown in previous FIG. 4. Turning to FIG. 5A, as for the interconnections of low-side array of switching elements 202, low-side array of switching elements 202 are connected together and to charging circuit 260 via a negative feedback path. Charging circuit 260 includes a differential transconductance amplifier configured by NPN emitter coupled pair 604-605 biased by a current mirror configured by PMOS transistors 607 and 608. A first input voltage to differential transconductance amplifier is reference voltage (VREF) 601. The negative feedback path begins at second input voltage, proportional to the regulated supply voltage (VCC), which is applied to the base of n-type bipolar junction transistor 605. The output of differential transconductance amplifier 604-605 drives PMOS transistors 352. In turn, the output current of PMOS transistor 352 is coupled to the regulated supply voltage (VCC). A voltage proportional to supply voltage (VCC) is coupled to the base of PMOS transistor 605 through resistors 610 and 611, thus completing the negative feedback path.

Referring to FIGS. 5B and 5C, in low-side array of switching elements 202, all gate terminals of PMOS transistors 352 are connected together and to the collector terminal of first bipolar junction transistor 604. The source terminals of all PMOS transistors 352 are connected together and to all drain terminals of PMOS transistors 322 in high-side array of switching elements 201, which are all connected to supply pads 342. All drain terminals of PMOS transistors 352 are all connected together and to the base terminal of second bipolar junction transistor 605, all connected to supply voltage (VCC) pad 215. Ground pads 373 of low-side switching elements 202 are connected together and to electrical ground 110G. Switch pads 343 of high-side array of switching elements 201 are connected to switch pads 372 of low-side array of switching elements 202 where currents from all high-side switching elements 201 and low-side switching elements 202 are added up together and all connected to output filter 220.

Referring again to FIG. 2B and FIG. 5 for the operation of high power switch-mode voltage regulator circuit 500, each high-side switching element 201 receives a drive signal in the form of an inverse Pulse Width Modulation ($\overline{PWM}$) at input terminal $207_{HS}$ that either pulls up or pulls down gate driver circuit 330. When gate driver circuit 330 is pulled up (e.g., $\overline{PWM}$ signal is at logic LOW), high-side DMOS switches 341 are turned ON and connects supply pads 342 to switch pads 343. At the same moment, in low-side array of switching elements 202, each low-side switching elements 202 receives a driver signal (PWM). Gate driver circuit 360 is pulled down to electrical ground 110G and low-side DMOS switches 371 are turned OFF. Accordingly, referring again to FIG. 2B, high-side switch node ($SW_{HS}$) 213 and low side switch node ($SH_{LS}$) 214 are connected to input voltage ($V_{IN}$) 208. On the other hand, when high-side switching elements 201 receives a high PWM signal and low-side array of switching elements 202 receives an opposite signal, gate driver circuit 330 are pulled down and gate driver circuit 360 are pulled up. As a result, high-side switch node ($SW_{HS}$) 213 and low side switch node ($SW_{LS}$) 214 are connected to electrical ground 101G.

Continuing with the operation of high power switch-mode voltage regulator circuit 500 of FIG. 5, floating boot strap charging circuit 250 and charging circuit 260 function to ensure respective high-side DMOS switches 341 and low-side DMOS switches 371 are alternately turned ON and OFF in such a manner to connect switch pads 343 and 372 to either input voltage ($V_{IN}$) or electrical ground 101G. In order to insure sufficient bias voltages are available to drive the gate of high-side DMOS switch 341, the voltage at the gate of PMOS transistor 321 is driven by the output of differential transconductance amplifier 401-402. Note that PMOS transistors 322 are always under the control of floating boot strap charging circuit 250 and can charge the boot strap voltage ($V_{BST}$) as long as the differential voltage between input voltage ($V_{IN}$) and switch voltage ($V_{SW}$) is higher than the forward voltage of diode 323. Prior art boot strap charging circuits only charge boot capacitor ($C_{BOOT}$) 122 when switch node (SW) 101SW is below a fixed voltage. Diode 323 prevents current from flowing from the boot capacitor ($C_{BOOT}$) connected to boot pad 211 into the PMOS the drain of PMOS transistor 321 wherein the voltage is higher than the input voltage ($V_{IN}$). In low-side array of switching elements 202, in order to insure sufficient bias voltages are available to drive the gate of low-side DMOS transistor 371, the gate voltage of PMOS transistor 352 is driven by the output of differential transconductance amplifier 604-605. Note that PMOS transistor 352 is always under the control of gate control circuit 250 and regulates supply voltage ($V_{CC}$).

Figure 6A:
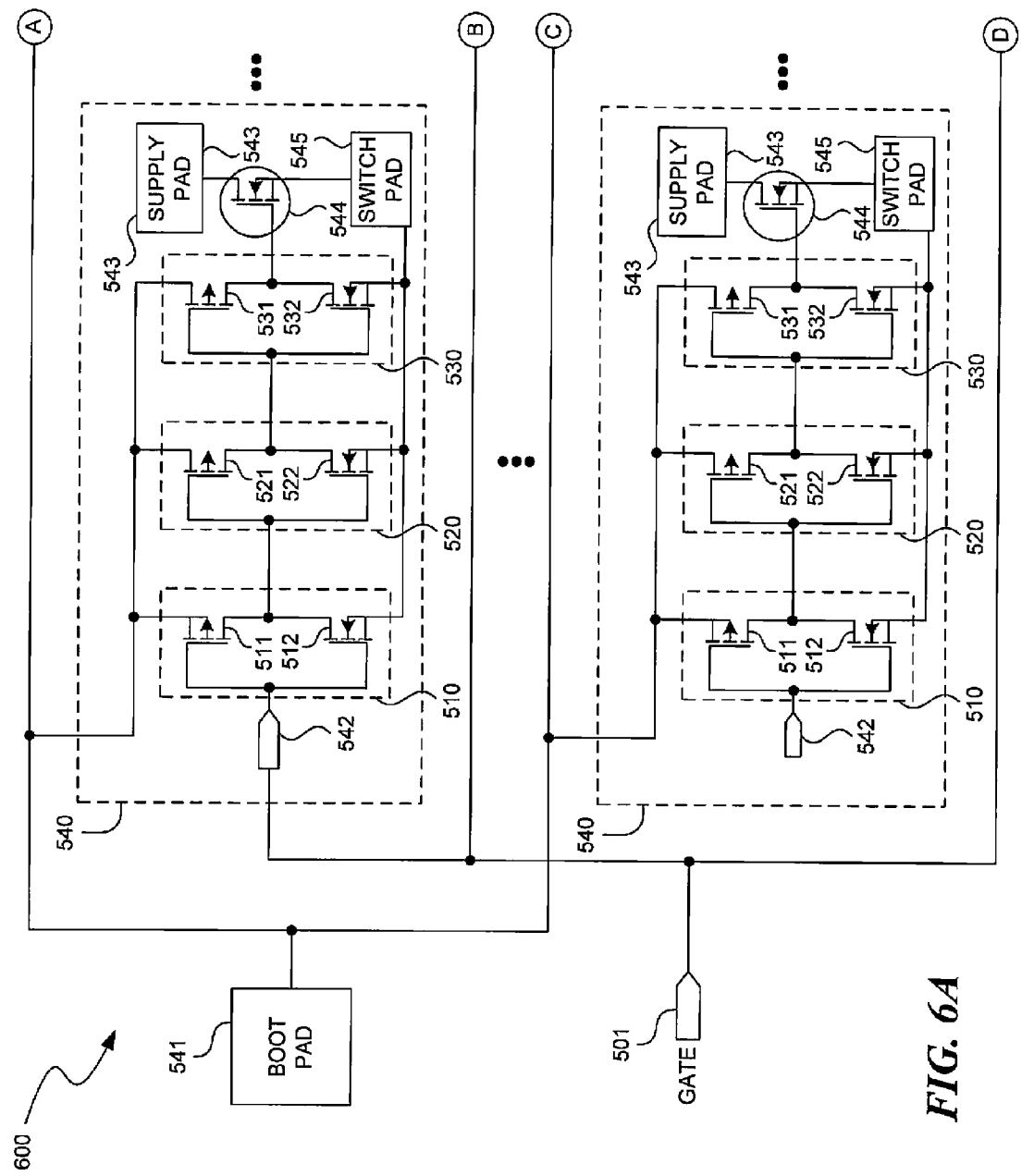
FIGS. 6A and 6B illustrate illustrates a detailed schematic diagram of a gate driver circuit in accordance with an embodiment of the present invention.
Figure 6B:
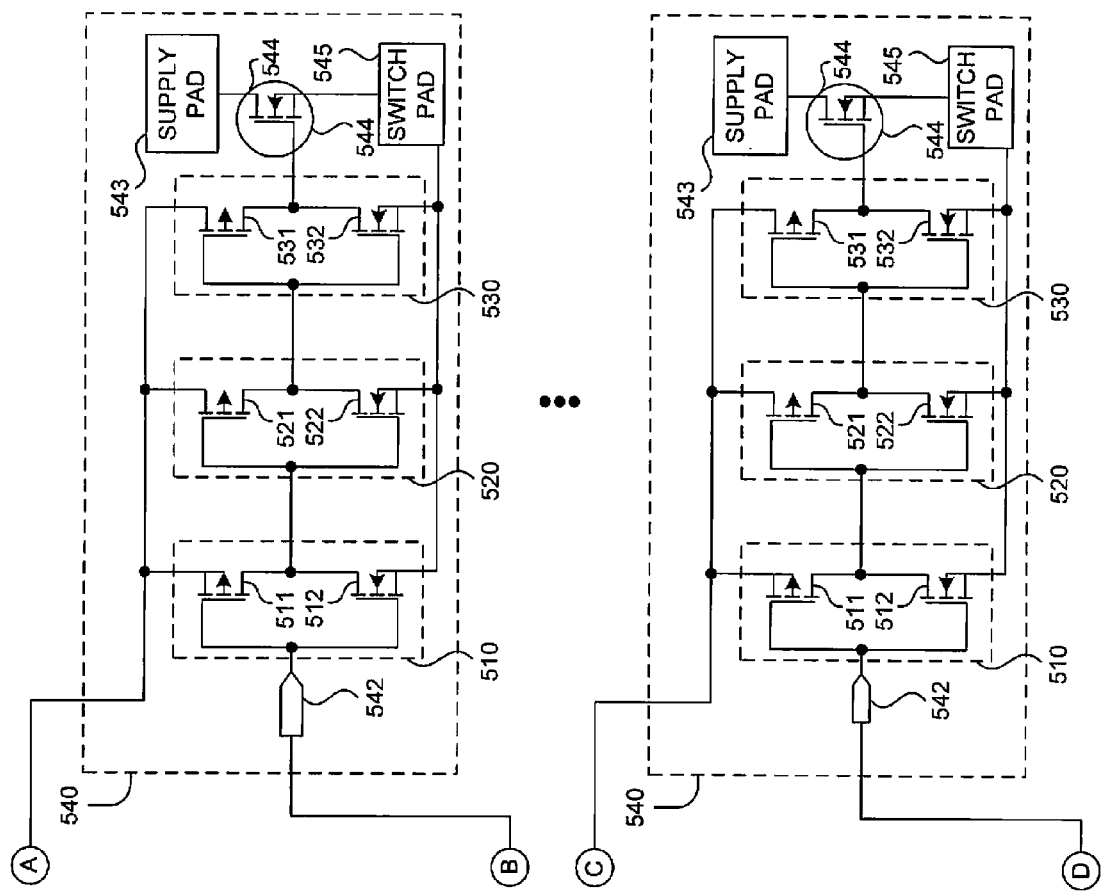

Now referring to FIGS. 6A and 6B, a schematic diagram of a high power switch-mode voltage regulator circuit 600 that has a different type of gate driver circuit is shown. High power switch-mode voltage regulator circuit 600 includes an array of switching elements 540. In each switching element 540, a gate driver circuit configured by a first inverter 510, a second inverter 520, and a third inverter 530. First inverter 510, second inverter 520, and third inverter 530 are coupled together in series to drive a power Double Diffused Metal Oxide Semiconductor Field Effect Transistor (DMOS) switch 544. First inverter 510 includes a pull-up PMOS 511 stacked on top of a pull-down NMOS transistor 512 to form an inverter. The gates of pull-up PMOS transistor 511 and pull-down NMOS transistor 512 are connected together to form an input terminal 542. Similarly, second inverter 530 includes a pull-up PMOS transistor 521 and a pull-down NMOS transistor 522. Finally, third inverter 530 includes a pull-up PMOS transistor 531 and a pull-down NMOS transistor 532. The source of pull-up PMOS transistor 531 is connected to the drain of pull-down NMOS transistor 532 to form an output terminal. The output terminal is connected to the gate of DMOS switch 544. The drain of DMOS switch 544 forms a supply pad 543 and the source forms a switch pad 545. Continuing with FIGS. 6A and 6B, all input terminals 542 of all switching elements 540 are connected together to form a gate input terminal 501. Gate input terminal 501 drives gate driver circuit configured by inverters 510, 520, and 530. The source terminals of all inverters 510, 520, 530 of all switching elements 540 are connected together and to a boot pad 541. It is noted that any type of gate driver circuit that drives switching element 540 is within the scope of the present invention.

Figure 7:
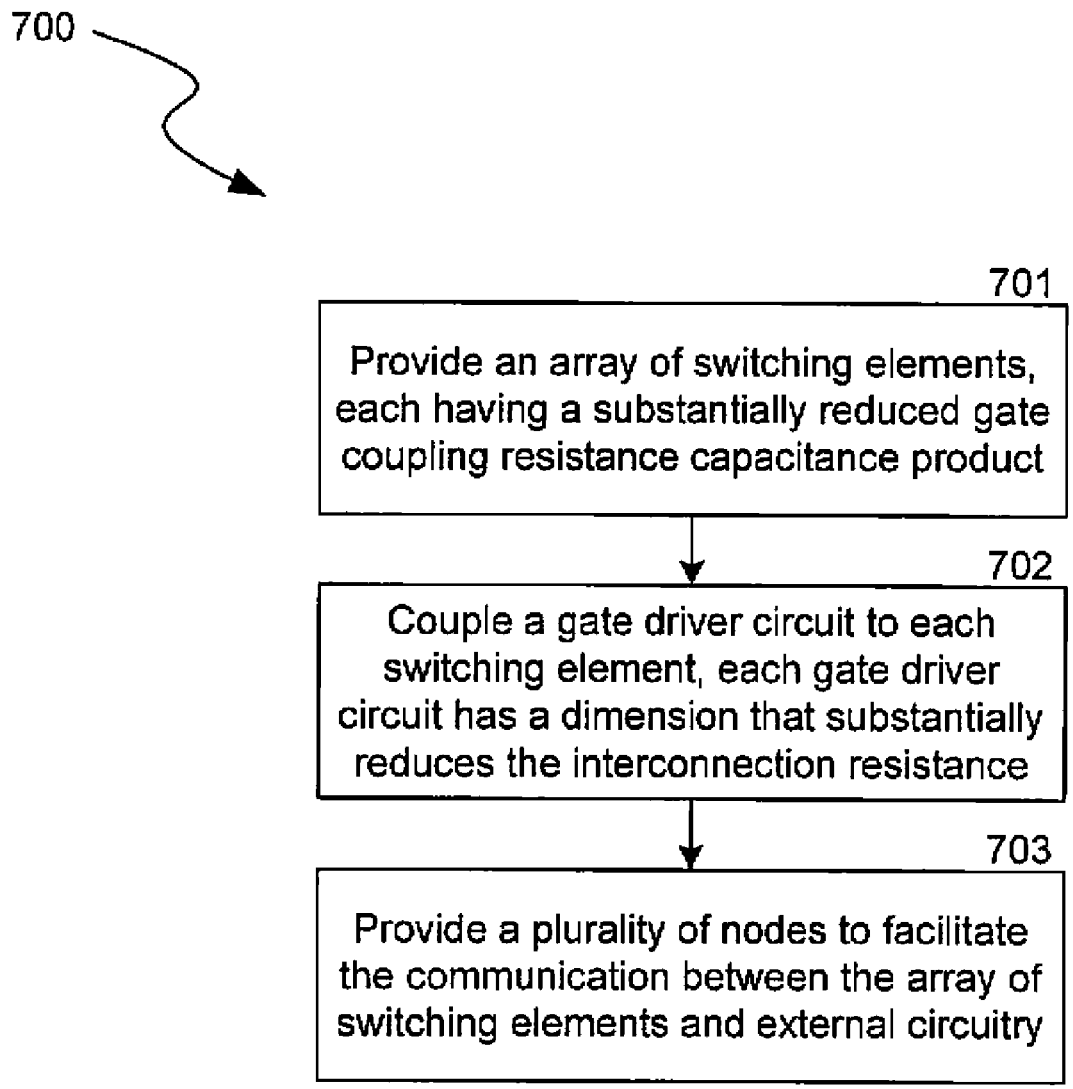
FIG. 7 a flow chart of a method of building high power switch-mode voltage regulator circuit in accordance with an embodiment of the present invention.

Now referring to FIG. 7, a flow chart of a method 700 of achieving high performance switch-mode voltage regulator that can produce large current, achieve high power efficiency, low interconnection resistance, small physical size, and low cost is illustrated. The disclosed method includes the steps of providing an array of switching elements, providing a plurality of gate driver circuit such that each gate driver circuit is electrically coupled and dedicated to driving only one switching element, and providing a plurality of electrical input/output nodes to facilitate the communication between the switching element and gate driver circuit pair to external circuitry.

Now referring to step 701, an array of switching elements, each having a substantially reduced gate coupling resistance capacitance product is provided. In step 701, instead of using a conventional discrete power Metal Oxide Field Effect Transistor (MOSFET) switch, an array of substantially smaller DMOS switches connected in parallel is used. Each DMOS switch has a dimension that substantially reduces the gate coupling resistance capacitance product. High-side array of switching elements 201 and low side array of switching elements 202 described in details in previous Figures is realized by the implementation of step 701.

Next, referring to step 702, a gate driver circuit is coupled to each switch element provided by step 701 in such a manner that the interconnection resistance between the driver circuit and its corresponding switching device is substantially reduced. In one embodiment of the present invention, the gate driver circuit is a logic circuitry that outputs logic level signals that drive high side switching elements 201 and low side switching elements 202. In one embodiment, step 702 is implemented by a single gate inverter circuit such as inverter circuit configured by pull-up PMOS transistor 332 and pull-down NMOS transistor 333 for high side switching element 201. For low side switching elements 202, gate driver circuit of step 702 can be implemented by pull-up PMOS transistor 362 connected in series to pull-down NMOS transistor 363. In one embodiment, step 702 is implemented by a series of inverter circuits such as inverter circuits 510, 520, and 530 as shown in FIG. 6.

Finally, referring to step 703, a plurality of electrical input/output (I/O) nodes are provided to facilitate the communication between the switching elements and external circuitry. Step 703 is implemented by input voltage electrical node 208, supply voltage node 209, high side switch node ($SW_{HS}$) 213 in FIG. 2A. In addition, low side switch node ($SW_{LS}$) 214 and ground node $209_2$ in low side array 270 are exemplary input/ output nodes shown in FIG. 2B. Finally, boot pad 211, supply pad 342, high side switch pads 343 and low side switch pad 372, electrical ground pads 373 are also implementations of step 703. In one embodiment, input/output (I/O) nodes are implemented so that they have minimal interconnection resistance. In one embodiment, input/output (I/O) electrical nodes include flip chip bumps placed substantially closed to DMOS switches 341 and 371. Furthermore, the implementation of input/output nodes of step 703 can also includes electrical leads, power buses, flip chip bumps, finger shaped structures, and other suitable means as disclosed in a patent application entitled "Layout Scheme for High Performance Switch-Mode Voltage Regulator Circuits" also by Paul Ueunten, filed on the same date with the present application, the disclosure of which is hereby incorporated by reference.

Obviously many modifications and variations of the present invention are possible in light of the above teachings. It is therefore to be understood that within the scope of the appended claims the invention may be practiced otherwise than as specifically described. It should be understood, of course, the foregoing disclosure relates only to a preferred embodiment (or embodiments) of the invention and that numerous modifications may be made therein without departing from the spirit and the scope of the invention as set forth in the appended claims. Various modifications are contemplated and they obviously will be resorted to by those skilled in the art without departing from the spirit and the scope of the invention as hereinafter defined by the appended claims as only a preferred embodiment(s) thereof has been disclosed.

I claim:

1. A high power switch-mode voltage regulator circuit, comprising:
    an array of switching elements, wherein each said switching element further comprises:
        a switching transistor circuit; and
        a gate driver circuit dedicated to drive the switching transistor circuit, wherein said switching transistor circuits of said array of switching elements are connected in parallel with drains connected together and sources connected together;
    a floating boot strap charging circuit electrically coupled to said array of switching elements and operable to regulate a switching voltage to said array of switching elements, and
    a plurality of passing circuitries each electrically coupled to the floating boot strap charging circuit to pass said switching voltage to one of said switching elements so that said gate driver circuit of the one of said switching elements is operable to turn on and off said switching transistor circuit of the one of said switching elements.

2. The high power switch-mode voltage regulator circuit of claim 1 wherein each of said passing circuitry further comprises a p-channel Metal Oxide Semiconductor Field Effect Transistor (PMOS transistor) and a diode electrically coupled in series to said PMOS transistor, the gate of said PMOS transistor being electrically coupled to said floating bootstrap charging circuit, and the drain of said PMOS transistor being electrically coupled to the anode terminal of said diode, the source of said PMOS transistor being electrically coupled to said switching transistor circuits, and the cathode terminal of said diode being electrically coupled to said gate driver circuits.

3. The high power switch-mode voltage regulator circuit of claim 2 wherein said floating bootstrap charging circuit further comprises a low drop-out (LDO) voltage regulator circuit.

4. The high power switch-mode voltage regulator circuit of claim 3 wherein said LDO voltage regulator circuit further comprises:
    an error amplifier having an output terminal that drives said plurality of passing circuitry and provides a voltage to said plurality of gate driver circuits; and
    a negative feedback circuit electrically coupling the drains of said high-side switching transistor circuits to an input terminal of said error amplifier.

5. The high power switch-mode voltage regulator circuit of claim 4 wherein said error amplifier further comprises:
    a first bipolar junction transistor and a second bipolar junction transistor electrically coupled to said first bipolar junction transistor, an emitter terminal of said first bipolar junction transistor being electrically coupled to an emitter of said second bipolar junction transistor, a base terminal of said first bipolar junction transistor being electrically coupled to a voltage reference ($V_{REF}$), a base terminal of said second bipolar junction transistor being electrically coupled to said negative feedback circuit;
    a first biasing resistor having a first terminal and a second terminal, said first terminal being electrically coupled to the emitter terminals of said first bipolar junction transistor and said second bipolar junction transistor, said second terminal being electrically coupled to an electrical ground; and
    a biasing current mirror circuit having a first p-channel Metal Oxide Semiconductor Field Effect Transistor (PMOS) and a second p-channel Metal Oxide Semiconductor Field Effect Transistor (PMOS), a gate of said first PMOS transistor being electrically coupled to a gate of said second PMOS transistor and to a drain of said second PMOS transistor, sources of said first PMOS transistor and said second PMOS transistor being electrically coupled together and to said plurality of passing circuitry, a drain of said first PMOS transistor being electrically coupled to the collector terminal of said first bipolar junction transistor and a drain of said second PMOS transistor being electrically coupled to a collector terminal of said second bipolar junction transistor, thereby forming said output terminal of said error amplifier.

6. The high power switch-mode voltage regulator circuit of claim 5 wherein said negative feedback circuit further comprises:
    a first resistor having a first terminal electrically coupled to each of said plurality of gate driver circuits;
    an p-channel Metal Oxide Semiconductor Field Effect Transistor (PMOS) having a source electrically coupled to a second terminal of said first resistor, the gate of said PMOS transistor being electrically coupled said high-side switching transistor circuits; and
    a second resistor having a first terminal electrically coupled to a drain of said PMOS transistor, and a second terminal of said second resistor being electrically coupled to an electrical ground.

* * * * *